(12) United States Patent
Tung et al.

(10) Patent No.: US 9,305,815 B2
(45) Date of Patent: Apr. 5, 2016

(54) AUTOMATED MATERIAL HANDLING SYSTEM AND METHOD FOR SEMICONDUCTOR MANUFACTURING

(75) Inventors: Chi-Feng Tung, Jhunan Township, Miaoli County (TW); Mao-Lin Kao, Zhunan Township, Miaoli County (TW); Hsiang-Yin Shen, Hsinchu (TW); Chin-Hsiang Lin, Hsin-chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 1043 days.

(21) Appl. No.: 13/409,540

(22) Filed: Mar. 1, 2012

(65) Prior Publication Data

US 2013/0230375 A1 Sep. 5, 2013

(51) Int. Cl.
*H01L 21/677* (2006.01)

(52) U.S. Cl.
CPC ...... *H01L 21/67706* (2013.01); *H01L 21/6773* (2013.01); *H01L 21/67727* (2013.01); *H01L 21/67733* (2013.01)

(58) Field of Classification Search
CPC .................................................. H01L 21/6773
USPC ........................................................ 414/279
See application file for complete search history.

(56) References Cited

U.S. PATENT DOCUMENTS

| | | | | |
|---|---|---|---|---|
| 3,403,799 A * | 10/1968 | Sindzinski et al. | ........... | 414/564 |
| 3,800,963 A * | 4/1974 | Holland | ........................ | 414/279 |
| 4,286,911 A * | 9/1981 | Benjamin | ...................... | 414/273 |
| 4,459,078 A * | 7/1984 | Chiantella et al. | ............ | 414/279 |
| 4,721,427 A | 1/1988 | Sanders et al. | | |
| 5,155,888 A | 10/1992 | Lau | | |
| 6,149,366 A * | 11/2000 | Deandrea | ...................... | 414/279 |
| 6,610,150 B1 | 8/2003 | Savage et al. | | |
| 6,715,978 B2 | 4/2004 | Lin et al. | | |
| 6,779,760 B2 | 8/2004 | Chang et al. | | |
| 6,997,670 B2 | 2/2006 | Kim et al. | | |
| 7,024,275 B2 | 4/2006 | Lai | | |
| 7,925,380 B2 | 4/2011 | Yu et al. | | |
| 2007/0039513 A1 | 2/2007 | Pinckney et al. | | |
| 2010/0143082 A1 | 6/2010 | Wang et al. | | |
| 2010/0242783 A1* | 9/2010 | Oguro et al. | ..................... | 104/91 |
| 2010/0278622 A1 | 11/2010 | Huang et al. | | |
| 2011/0106300 A1 | 5/2011 | Wang et al. | | |

\* cited by examiner

*Primary Examiner* — Jonathan Snelting
(74) *Attorney, Agent, or Firm* — Duane Morris LLP

(57) ABSTRACT

A rail transport system and method for a semiconductor fabrication facility (FAB). In one embodiment, the system includes a network of stationary rails and a wheeled vehicle movable on the rails via rolling movement. The vehicle is operable to hold a wafer carrier that stores a plurality of wafers. A cross-floor transport system is provided that may include a vehicle lifter positioned near the network of rails that extends between a first elevation and a second elevation in the FAB. The lifter is configured and operable to receive the vehicle from rails at the first elevation and vertically transport the vehicle to rails at the second elevation without removing the wafer carrier from the wheeled vehicle. In one embodiment, the lifter is configured so that the vehicle may be rolled directly onto and off of the lifter for vertical transport.

18 Claims, 9 Drawing Sheets

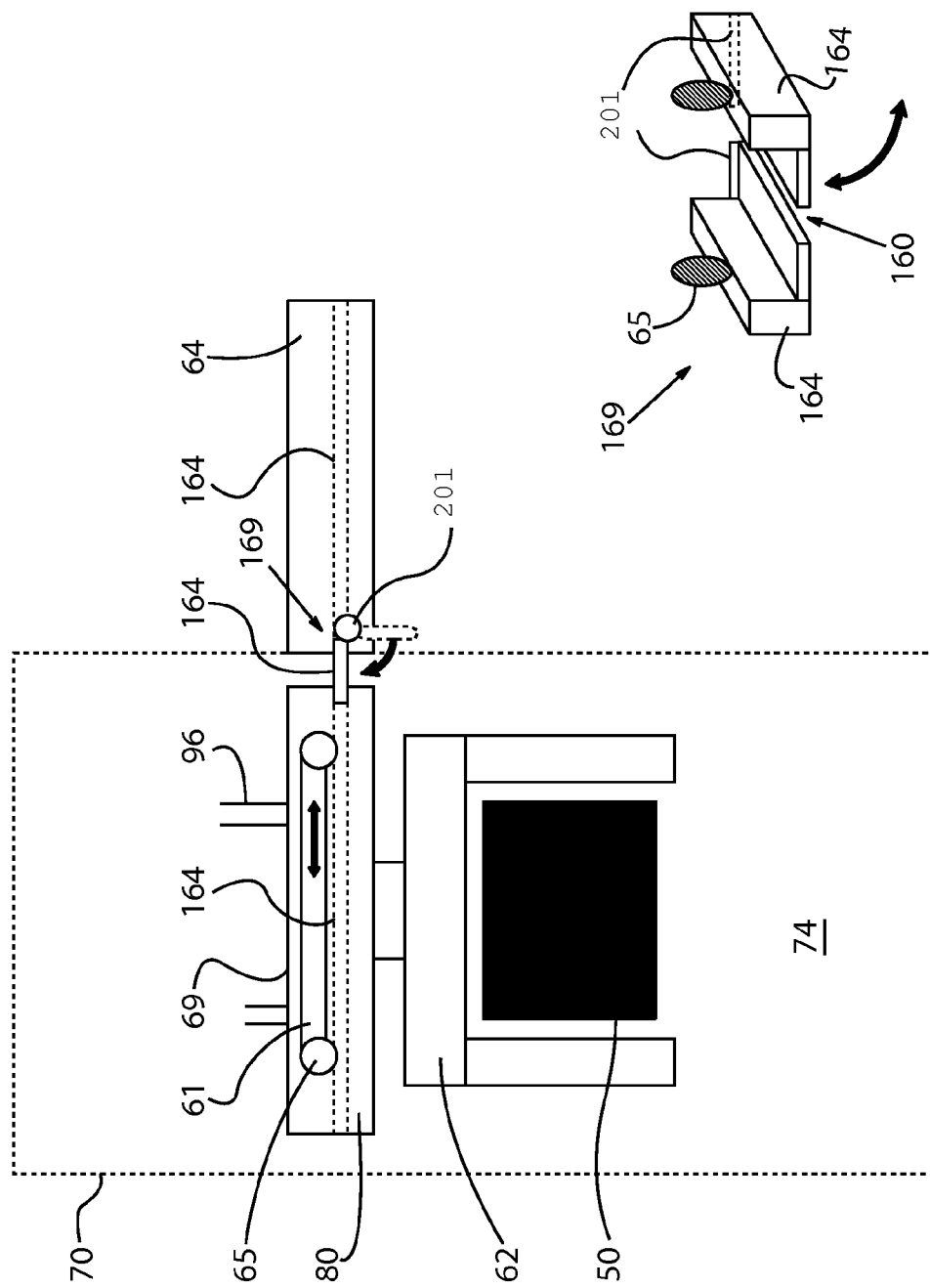

AUTOMATED MATERIAL HANDLING SYSTEM AND METHOD FOR SEMICONDUCTOR MANUFACTURING

TECHNICAL FIELD

The present disclosure generally relates to semiconductor manufacturing foundries or facilities, and more particularly to automated material handling systems used in such facilities.

BACKGROUND

Automated Material Handling Systems (AMHS) have been widely used in semiconductor fabrication facilities ("FABS") to automatically handle and transport groups or lots of wafers between various processing machines ("tools") used in chip manufacturing. A typical FAB may include one or more floors having a plurality of process bays including processing tools and wafer staging equipment which are interconnected by the AMHS.

Each bay may include a wafer stocker, which includes multiple bins for temporarily holding and staging a plurality of wafer carriers during the fabrication process. The wafer carriers may include standard mechanical interface (SMIF) pods which may hold a plurality of 200 mm (8 inch) wafers, or front opening unified pods (FOUPs) which may hold larger 300 mm (12 inch) wafers. Stockers generally include a single mast robotic lift or crane having a weight bearing capacity sufficient for lifting, inserting, and retrieving a single wafer carriers at one time from the bins. The stocker holds multiple SMIF pods or FOUPs in preparation for transporting a SMIF or FOUP to the loadport of a processing tool.

A semiconductor FAB may include numerous types of automated and manual vehicles for moving and transporting wafer carriers throughout the FAB during the manufacturing process. These may include for example automatic guided vehicles (AGVs), personal guided vehicles (PGVs), rail guided vehicles (RGVs), overhead shuttles (OHSs), and overhead hoist transports (OHTs). An OHT system automatically moves OHT "vehicles" that carry and transport wafer carriers, such as SMIF pods or FOUPs holding multiple wafers, from a processing or metrology tool or a stocker to the loadport of another tool or other apparatus in the FAB. The OHT system may be used to transport vehicles within each bay (intra-bay) or between bays (inter-bay). The OHT system also moves empty vehicles (i.e. without a wafer carrier) to the tool loadport or other apparatus for receiving and removing empty or full SMIF pods or FOUPs that may contain wafers for further transport and/or processing in other tools.

Handling and transport of 300 mm wafers in correspondingly larger and heavier FOUPS creates efficiency challenges for the AMHS to maintain expedient wafer flow between processing tools in the semiconductor FAB. In addition, construction of large "Giga FABS" with potential capacities to handle processing of more 100,000-300 mm wafers per month creates additional demands. These challenges and demands include efficient use of floor and overhead space in the FAB, handling increased transportation volumes of FOUPs, reducing wafer transport system bottlenecks at various process choke points that create wafer carrier vehicle "traffic jams," and expedient intra-bay and inter-bay FOUP transportation including cross-floor (i.e. between floor) transport of FOUPS between multiple floors in a Giga FAB.

An improved system and method for handling wafer transport in a semiconductor FAB is desired.

BRIEF DESCRIPTION OF THE DRAWINGS

The features of the embodiments will be described with reference to the following drawings where like elements are labeled similarly, and in which:

FIG. 9 is a side of the vehicle lifter and a portion of stationary rail including one embodiment of a rail coupling device comprised of a pivotable rail section; and FIG. 10 is a perspective view of the rail coupling device thereof.

Figure 1:
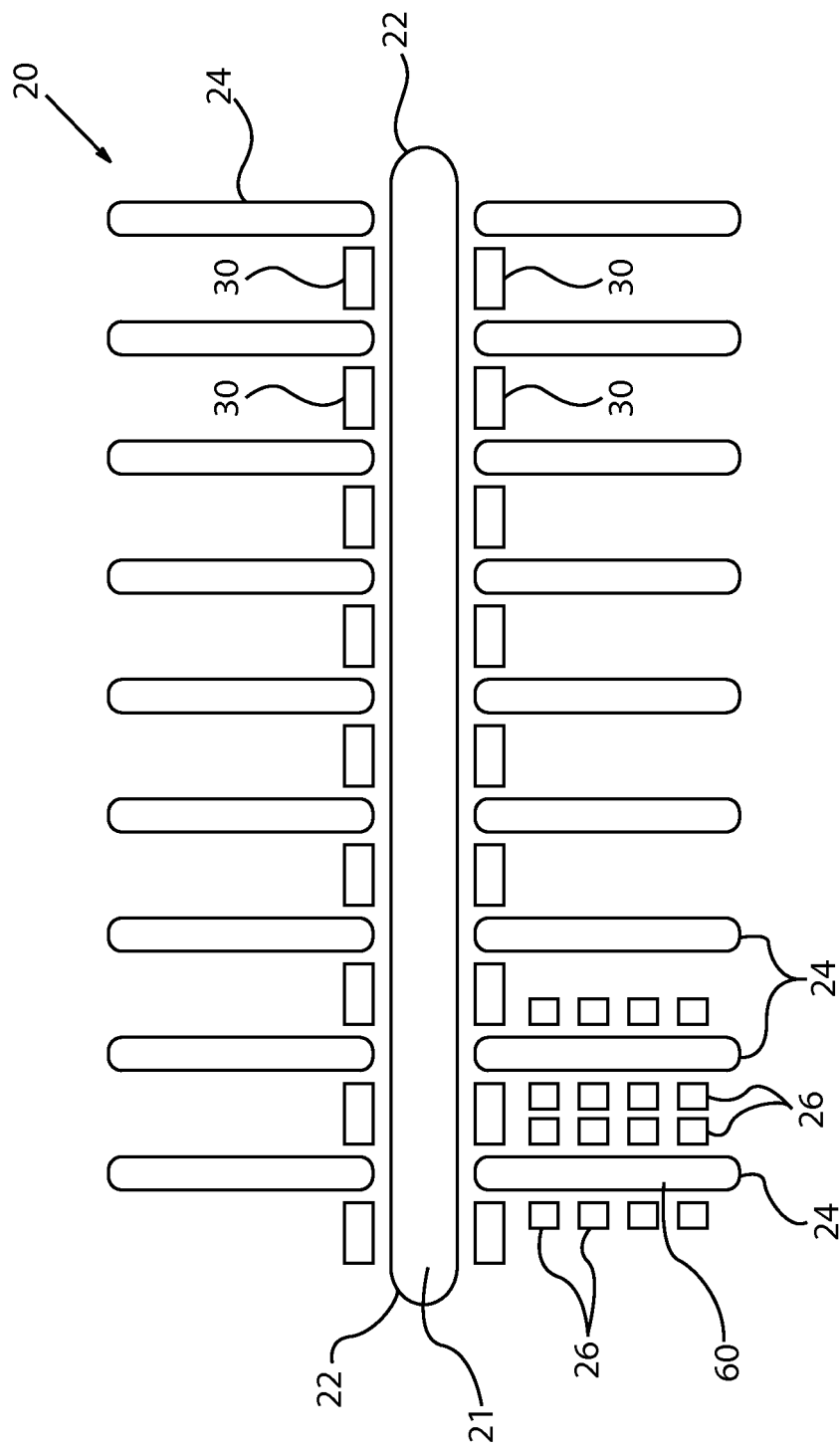
FIG. 1 is a schematic layout diagram of an exemplary semiconductor FAB including an OHT rail and vehicle system.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto. The terms "chip" and "die" are used interchangeably herein.

FIG. 1 is a schematic diagram of one possible embodiment of a semiconductor FAB 20 including a central corridor or aisle 22 and a plurality of bays 24 arranged on opposing lateral sides of the aisle. FAB 22 includes an AMHS 21 which may be comprised of, without limitation AGVs, PGVs, RGVs, overhead shuttles OHSs, and OHTs. One or more wafer stockers 30 may be provided which are associated with each bay 22 and operable for receiving and staging wafer carriers 50 (see FIG. 2) for processing in one or more wafer fabrication or metrology tools 26 arranged in each bay. In some embodiment, one or more bays 22 may include an OHT system 60 (see also FIG. 2). FAB 20 may be a multi-floor facility in some embodiments having one or more floors 1F, 2F, etc. as in FIG. 2. In some embodiments, FAB 20 may be a Giga FAB.

Figure 2:
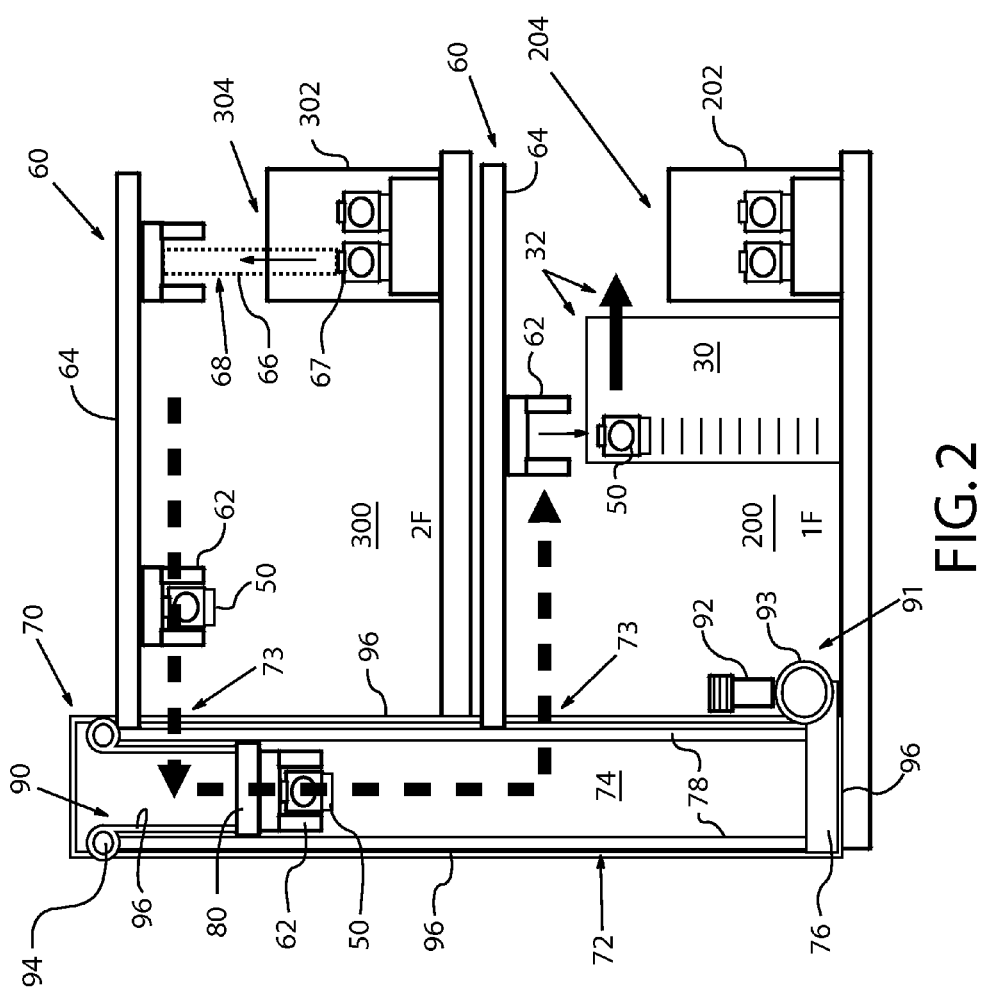
FIG. 2 is a side view of a portion of the semiconductor FAB of FIG. 1 and OHT system, and showing an exemplary embodiment of a cross-floor transport system according to the present disclosure with an OHT vehicle during vertical transport between two sections of rail at different elevations.

FIG. 2 is a schematic diagram showing a side view through a portion of semiconductor FAB 20 which includes an AMHS 21 according one exemplary embodiment of the present disclosure. Two floors 1F and 2F are shown for descriptive purposes; however, FAB 20 may contain any number of floors. Each floor 1F and 2F includes at least one process bay 200 and 300, respectively. Each process bay 200, 300 may further include a plurality of process tools 202, 302 for performing various semiconductor manufacturing, testing, or metrology steps. Multiple process bays are typically provided on a floor of a FAB, arranged on either side of a main central aisle 22 as shown in FIG. 1.

Process bay 200 includes at least one process tool 202 having a loadport 204 for inserting and removing wafer carriers 50 into or from the tool for processing. Loadport 204 may include separate loading and unloading ports in some embodiments to expedite wafer carrier 50 switchover between the OHT system 60 and tool 202. Bay 300 similarly is shown to include at least one process tool 302 with an associated loadport 304. Process tools 202 and 302 may be any type of wafer handling, fabrication, testing, metrology, or other equipment commonly used in a semiconductor FAB.

With continuing reference to FIG. 2, embodiments of AMHS 21 may include one or more OHT system 60 using a network of tracks or rails 64 operable to guide the movement of one or more wheeled OHT vehicles 62 which may be supported and suspended from the rails 64. In some embodiments, the rails 64 may be monorails that are affixed to and suspended from the ceiling. OHT vehicles 62 are operable to transport wafer carriers 50 through FAB 20 for intra-bay or inter-bay movement. In one embodiment, each OHT vehicle 62 may be configured and structured to hold one wafer carriers 50 at a given time and transport the carrier 50 in a generally horizontal direction from one location to another within each bay 200, 300 (intra-bay) or between bays (inter-bay) on a single FAB floor 1F or 2F.

Figure 3:
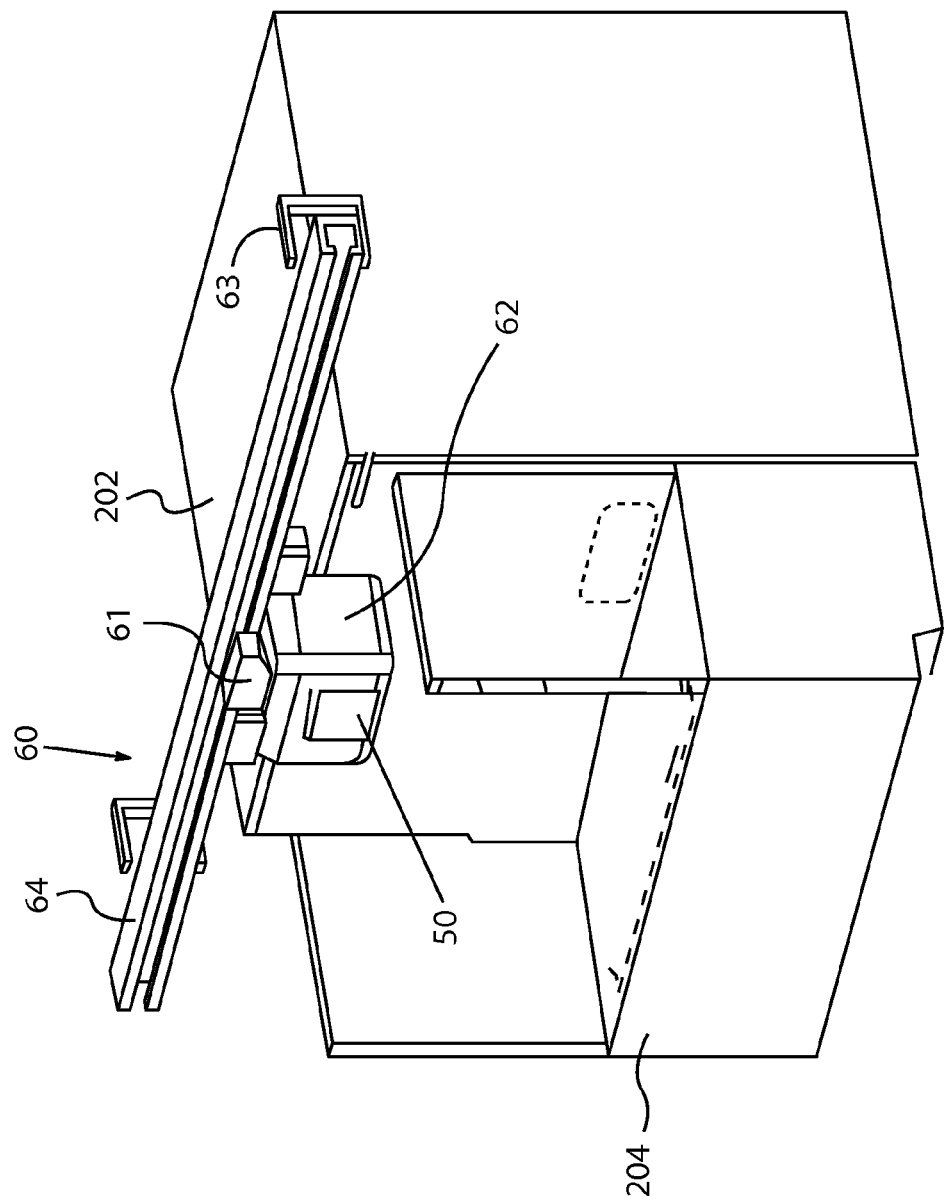
FIG. 3 is a perspective view of an exemplary semiconductor processing tool and portion of an OHT vehicle system with OHT vehicle positioned near the loadport of the tool.

Referring to FIG. 3, OHT vehicles 62 may include at least one wheeled trolley 61 which is configured to complement and cooperate with rails 64 for rolling movement of the vehicle laterally or horizontally along the rail in a conventional manner. Vehicle 62 is suspended and supported from rail 64 via the trolley 61. Rails 64 of the OHT system 60 may have any suitable cross-sectional configuration or orientation used in the art. In one possible, but non-limiting embodiment shown schematically in FIG. 3, rails 64 may be configured as C-shaped structural members generally made of a suitably strong metal such as steel to support the weight of a OHT vehicles 62 carrying a fully loaded wafer carrier 50 held therein.

Figure 4:
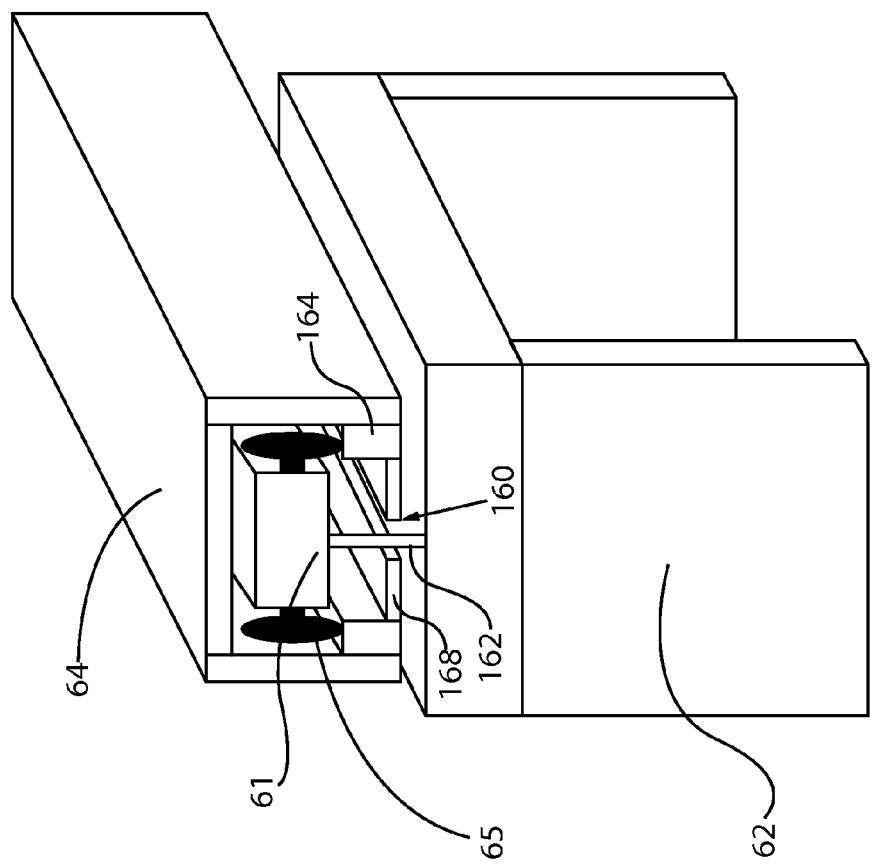
FIG. 4 is close-up perspective view showing a portion of stationary rail of the OHT rail system and rail-guided wheeled OHT vehicle mounted thereon for rolling movement.

It will be appreciated by those in the art that other possible cross-sectional configurations of rail 64 may be used, including without limitation box beams with a longitudinally-extending bottom slot 160 as shown in FIG. 4 that receives therethrough a vertical support 162 such flange, rod, or other suitable structural member connecting wheeled trolley 61 movably disposed inside the rail to the attached OHT vehicle 62 suspended below. Accordingly, embodiments of a rail 64 with mating wheeled trolley 61 according to the present disclosure are not limited to any particular configuration so long as the OHT vehicle 62 may be appropriately supported from the rail for rolling motion The rails 64 may be suspended from the ceiling of the FAB 20 by intermittently spaced rail mounting brackets 63 (see, e.g. FIG. 3). As shown in the schematic perspective diagram in FIG. 4, the trolley wheels 65 are disposed internally within the interior space bounded by rail 64 and may roll along the inside of the rail in either axial direction. The rail 64 may include laterally spaced apart inside tracks 164 configured for rolling receiving the trolley wheels 65 thereon and bottom closure plate 168 defining slot 160. FIG. 4 shows one possible embodiment of a trolley 61 having four trolley wheels 65 (only two are visible in the figure). However, any suitable number of trolley wheels may be provided depending on the configuration of the rail and trolley used, and the weight of the OHT vehicle 62 supported by the trolley. In some embodiments, trolley 61 includes a conventional trolley motor drive which is mechanically coupled to and operative to rotate a pair of the wheels 65 which are driven wheels for rolling the trolley along rail 64. Other wheels 65 may be idler wheels which are not coupled to the motor drive.

In one embodiment, the OHT system 60 includes a network of rails 64 that are interconnected and which may be mounted near the ceiling of the FAB 20 on each floor as shown in FIG. 2. Multiple rails 64 may be arranged into a transport network of any suitable configuration as appropriate for a given FAB (see, e.g. FIG. 1), including without limitation one or more main branches of rails each having one or more multiple cross or lateral branches, multiple parallel branches, and loops. Within a bay 200, 300, the rails of the OHT system 60 may often be arranged in a loop, as shown for example in FIG. 1. Some typical FAB and OHT system arrangements are further described in commonly owned U.S. Pat. Nos. 7,925,380; 7,024,275; 6,779,760; 6,715,978; and U.S. Patent Application Publications 2010/0278622 and 2011/0106300, all of which are incorporated herein by reference in their entireties.

Referring to FIG. 2, OHT vehicles 62 are configured and operable to pickup, raise/lower, hold, articulate, and release a wafer carrier 50. Such OHT vehicles and rails systems are known in the art and commercially available from companies such as Daifuku Company, Ltd. of Osaka, Japan and Muratec Automation Company, Ltd. of Aichi, Japan and others. OHT vehicles 62 include a motorized or pneumatic hoisting mechanism generally comprised of gripper assembly 68 including one or more retractable and extendable gripper arms 66 having a gripper 67 on the end thereof configured for locking onto a mating hook or flange on the wafer carrier 50. The gripper arms 66 are operable to raise and lower the gripper 67 and attached wafer carrier 50. Generally, an OHT vehicle 62 transports a single wafer carrier 50 at a time.

With continuing reference to FIG. 2, wafer carrier 50 may be any type of wafer carrier such as a SMIF pod or FOUP. Each wafer carrier 50 holds a plurality of wafers. For example, one FOUP may hold approximately 25 wafers of the 300 mm size. A SMIF pod or FOUP generally includes various appurtenances as will be commonly recognized to those in the art, including without limitation coupling mechanisms for docking to a loading port of a process tool or stocker, hooks or flanges for grasping by the gripper of an OHT vehicle, side rails for pickup by a robotic arm, plurality of internal slots for holding the wafers in spaced relationship, and openable/closeable and sealable doors to maintain the wafers in a controlled environment during transport isolated from the ambient FAB conditions to prevent contamination. Wafer carriers are commercially-available from various companies, such as for example Entegris, Inc. of Billerica, Ma. and others.

Each process bay 200, 300 may further include one or more stockers 30 shown in FIG. 2. Stockers 30 includes internal bins for temporarily staging and storing multiple wafer carriers 50 in preparation for transport to the loadport of a processing tool 202, 302. Accordingly, stockers 30 provide a wafer carrier transportation system and process flow buffer and holdover area. Each stocker 30 includes an input/output port 32 for loading and unloading wafer carriers 50 from the stocker. The stocker 30 may include one or more robotic arms (not shown) that are operable to grasp, raise/lower, store, and retrieve a wafer carrier 50 from the stocker as will be known to those in the art. A typical stocker, for example, is described in commonly owned U.S. Patent Application Publication 2010/0143082, which is incorporated herein by reference in its entirety. Stockers are commercially available.

According to one aspect of the present disclosure, a cross-floor transportation system is provided for transporting wafer carriers vertically between various FAB floors. In some embodiments, the wafer carriers alone such SMIF pods or FOUPs may be transferred vertically back and forth between floors in the FAB. This type system may use hand-over areas between the OHT system and a lifting tower having a lightweight robotic lifter which has a load capacity and is operable to raise or lower a wafer carrier between floors. With this approach to cross-floor transportation, the wafer carrier is first removed from the OHT vehicle on a first origination floor, transferred into/from the lifter via a robotic arm through an inlet/outlet port, raised or lowered to the second floor by the lifter, and transferred back to a waiting empty OHT vehicle on the second destination floor via a robotic arm. If there is a backup of wafer carriers on the second floor, the wafer carrier may be temporarily stored in the tower and later retrieved from storage in the tower.

Referring to FIG. 2, an embodiment of a cross-floor transportation system is shown in which the wafer carrier 50 remains in the OHT vehicle 62, and the OHT vehicle with wafer carrier held therein is raised/lowered between floors in the FAB. The OHT vehicle 62 is transported between floors (e.g. such as 1F and 2F) by a heavy duty vehicle lifter 70 having a load capacity sufficient to lift a loaded OHT vehicle 62. This approach utilizes a single OHT vehicle 62 for cross-floor transport without a hand-over step or area on each floor as the wafer carrier 50 is not physically removed or disengaged from the original carrier until it reaches its intended destination.

In one embodiment shown in FIG. 2, vehicle lifter 70 includes a structural base 76 and a vertically-rising support frame 72 defining an open central area or shaft 74 configured and dimensioned for receiving an OHT vehicle 62 therein for upwards and downward movement. An access area or port 73 to vehicle lifter 70 is provided on each floor (e.g. 1F, 2F, etc.) to provide access to the central open shaft 74. Access port 73 is configured and dimensioned to allow an OHT vehicle 62 to pass therethrough. The sides of the vehicle lifter support frame 72 may be open, closed, or a combination of closed and open areas. The support frame 72 extends between floors as shown.

With continuing reference to FIG. 2, vehicle lifter 70 includes a heavy duty lifting mechanism 90 which is configured and operable to engage, raise/lower, and release an empty OHT vehicle 62 or loaded OHT vehicle holding a wafer carrier 50. In one embodiment, lifting mechanism 90 includes a movable OHT vehicle cradle 80 which is configured to receive, hold, and then release/dispatch an OHT vehicle 62 via rolling engagement of the vehicle wheels 65 with the cradle. In some embodiments, without limitation, lifting mechanism 90 may be configured similarly to stacker cranes, which are known to those in the art and commercially available from companies such as Mecalux, SA of Barcelona, Spain and others.

Figure 8:
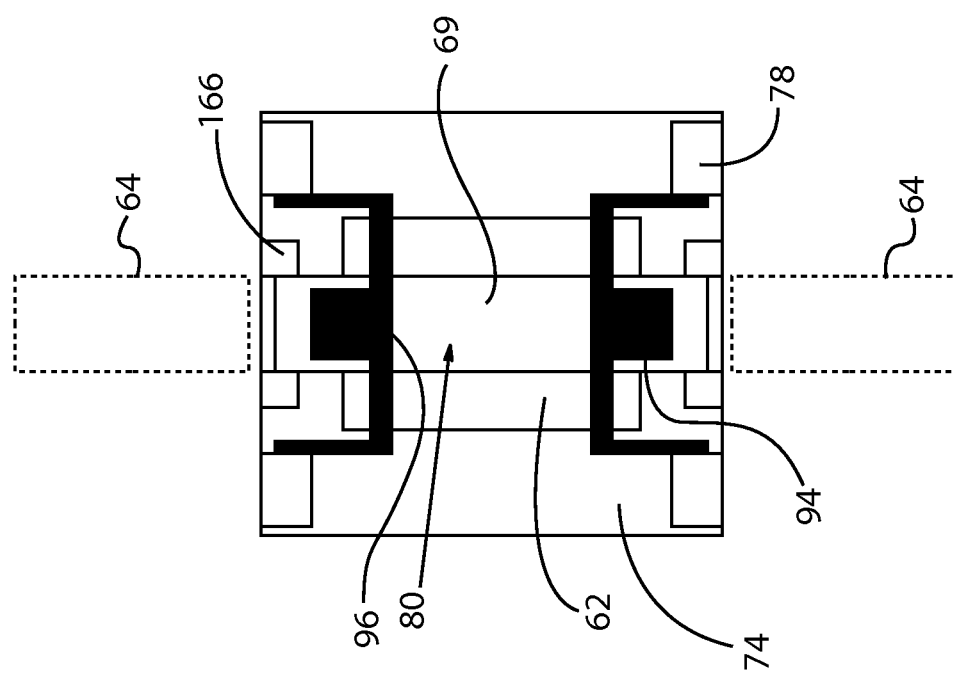
FIG. 8 is a top cross-sectional view taken through the vehicle lifter.

Vehicle cradle 80 is coupled to a power drive system 91, which in one embodiment may include a combination of a motor drive 92 such as a gear motor, one or more lifting chains or cables 96 (hereafter collectively referred to as "cables") and guide pulleys 94, and other appurtenances commonly found in stacker cranes that are useful for raising, lowering, and controlling operation of the cradle 80. In one possible embodiment as shown in FIG. 2, pulleys 94 may be positioned proximate to the top of the vehicle lifter 70 and supported by a frame 72 which may include one or more structural columns or masts 78 and structural cross members. In some embodiments, a double mast 78 system may be used as shown in FIGS. 2 and 8 wherein two pulleys 94 are mounted on the masts 78 or structural cross members attached thereto to increase the total load bearing capacity of the vehicle lifter 70. As best shown in FIG. 8, the double mast system may include an opposing pair of masts 78 for stability. Cables 96 may be any suitable commercially-available steel or other cables of suitable load bearing capacity to support the weight of the vehicle cradle 80 and an OHT vehicle 62 holding a fully-loaded wafer carrier 50. In some embodiments, cables 96 may have a total combined load bearing capacity of greater than 100 kg to accommodate such loads.

Cables 96 are attached to vehicle cradle 80 and routed over pulleys 94, then routed along masts 78 back to the drum 93 of the drive motor 92 as schematically shown in FIG. 2. Drive motor 92, which may be an electric gear motor in some embodiments, is operable to impart raising or lowering motions to the vehicle transporter 80 by winding or unwinding cable 96 from the motor drum 93 via manual or automatic operation of the drive motor 92 by operation of an AMHS processor-based control system that may be provided.

In some embodiments, drive motor 92 may be mounted near base 76 of vehicle lifter 70. In alternative embodiments, drive motor 92 may be mounted near the top of vehicle lifter 70 above vehicle cradle 80 on a suitable structural member that may be supported by the masts 78.

In some embodiments, vehicle lifter 70 may be rigidly mounted on the FAB floor via bottom base 76 which may be bolts to the floor so that the lifter and masts are not movable, but remain in a stationary fixed lateral or horizontal position as shown in FIG. 2. In alternative embodiments contemplated, vehicle lifter 70 may include lateral or horizontal movement capability similar to stacker cranes to allow the OHT vehicle 62 to be transported not only vertically between floors, but also horizontally to different bays on different floors wherein the rails 64 on each floor may not be vertically aligned. In this alternative embodiment, vehicle lifter 70 may include a bottom guide or mounting base that is wheeled and mounted on a horizontal rail fixed to the FAB floor. An appropriate drive system including one or more gear motors and related controls may be provided to move vehicle lifter 70 horizontally along the rail to alter the horizontal position of the lifter. Such horizontal movement mechanisms for stacker cranes are well known in the art, and commercially available from companies such as Mecalux, SA of Barcelona, Spain and others.

Figure 5:
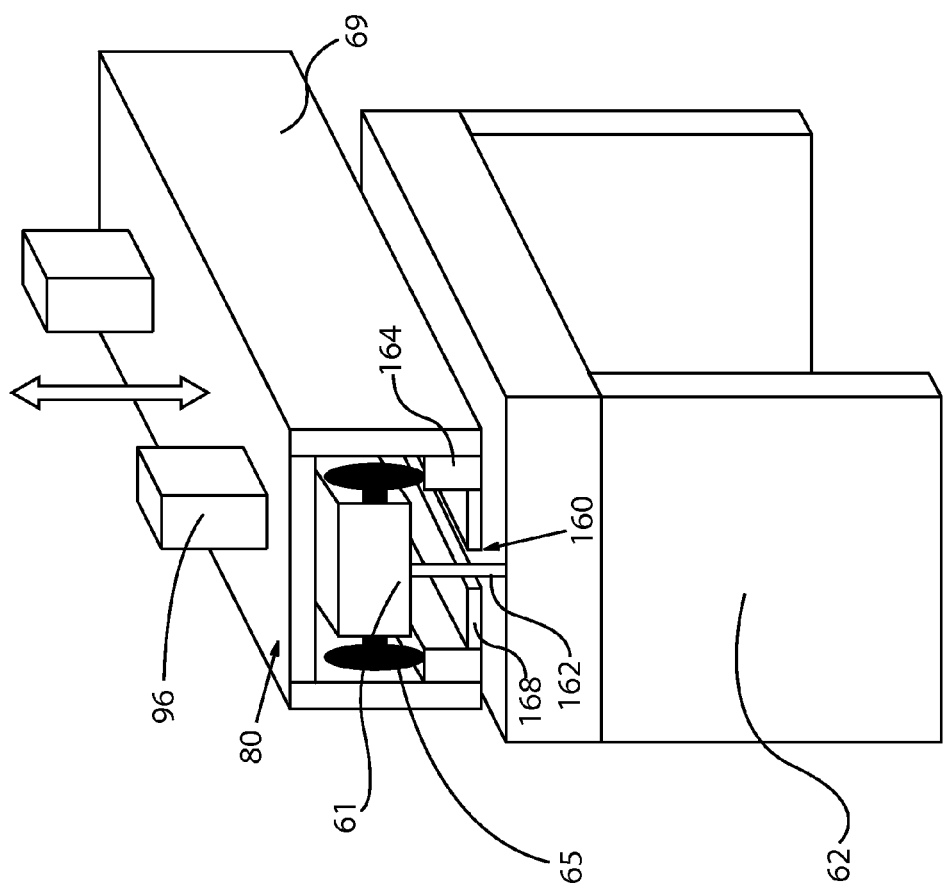
FIG. 5 is a close-up perspective view of a vertically movable vehicle lifter and rail-guided wheeled OHT vehicle of FIG. 4 positioned thereon for upward or downward vertical transport.

With continuing reference to FIG. 2, vehicle cradle 80 in some embodiments may be configured as a vertically moveable section of OHT track or rail 69 as shown in FIG. 5, which is complementary configured with stationary OHT system rails 64 that are mounted in FAB 20 on floors 1F and 2F (shown in FIG. 4). OHT vehicle 62 may be directly rolled from stationary rail 64 onto moveable rail 69. In one embodiment, movable rail 69 may be fastened to and supported overhead from support frame 72 and/or masts 78 by cables 96 as previously described. Vehicle cradle 80 is vertically movable upwards and downwards between different elevations within a floor 1F, 2F or between floors 1F and 2F within open shaft 74 of lifting mechanism 90 via operation of the power drive motor 92 (see directional arrows in FIG. 5).

Vehicle cradle 80 may be appropriately guided within shaft 74 of lifting mechanism 90 to restrict lateral movement of the vehicle cradle both at each docking station 100, 102 while OHT vehicle 62 is moved onto or from the cradle rail 69 (see, e.g. FIGS. 6 and 7), and when moving vertically within the shaft between floors 1F and 2F (see, e.g. FIG. 2). FIG. 8 shows a top cross-sectional view through vehicle lifter 70 and open central shaft 74 with vehicle cradle 80 including movable rail 69 positioned therein. In some embodiments, the vertical movement of vehicle cradle 80 may be centered and guided within open central shaft 74 by two pairs of opposing vertical rail guides 166 which are disposed proximate and laterally adjacent to the ends of movable rail 69 as shown. Rail guides 166 are oriented vertically and extend up and down within open central shaft 74 for at least a height corresponding to the maximum vertical travel limits of the vehicle cradle 80 within vehicle lifter 70. Rail guides 166 prevent excessive lateral movement of the movable rail 69. As further shown in FIG. 8, the vehicle lifter 70 may be accessible from stationary rails 64 on either side of the lifter. Accordingly, vehicle lifter 70 may be configured with access ports 73 on two sides for receiving OHT vehicle traffic from stationary rails 64 in two opposing horizontal directions.

One exemplary embodiment of a method for operating vehicle lifter 70 will now be described.

Figure 6:
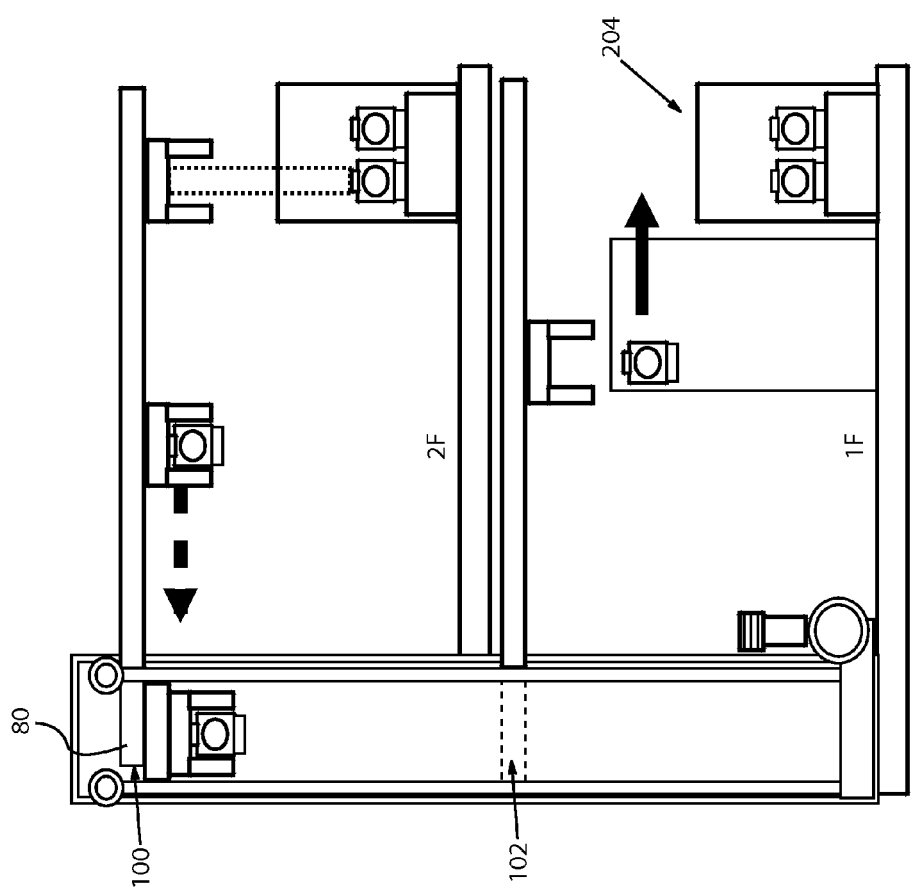
FIG. 6 is a side view similar to FIG. 2 showing the OHT vehicle and vehicle lifter at a first elevation and docking station associated with the vehicle lifter.

Referring to FIG. 6, vehicle cradle 80 is first positioned at an upper docking station 100 adjacent to floor 2F for receiving OHT vehicle 62. OHT vehicle 62 is shown carrying a wafer carrier 50. Movable cradle rail 69 is axially aligned with stationary rail 64 of the OHT system 60 on floor 2F adjacent access port 73. Cradle rail 69 is in close proximity or otherwise temporarily coupled to rail 64 via a movable coupling mechanism so that OHT vehicle 62 may roll relatively smoothly onto cradle rail 69 without significant interference. It is desirable that any gap that may exist between the lateral end of cradle rail 69 and lateral end of stationary rail 64 proximate to the cradle rail is smaller than the diameter of wheel 65 on trolley 61 of OHT vehicle 62, and in some embodiments less than the radius of wheel 65 so that the wheels may freely roll onto the cradle rail without binding.

In some embodiments, as shown in FIG. 9, a rail coupling system may be provided to ensure smooth OHT vehicle 62 rolling movement from stationary rails 64 onto movable rail 69. The rail coupling system may include a pivotable section of rail 169 as further shown in FIG. 10 which rotates around a hinged pivot 201 attached to stationary rail 64. The pivotable rail section 169 may include tracks 164 and in some embodiments a bottom closure plate 168 matching the configuration of the tracks and closure plates in stationary rail 64 and movable rail 69 as shown in FIGS. 4 and 5. The pivotable rail section 169 may be operated by a conventional and commercially available hydraulic or motor actuator (not shown) which is operable to pivotably raise and lower the rail section 169 as shown (see solid and dashed lines representing upper coupled and lower uncoupled positions of the rail 169). When pivotable rail section 169 is in the upper coupled position (see solid lines), the wheeled trolley 61 of OHT vehicle 62 may be smoothly rolled from stationary rail 64 onto movable rail 69. Once the wheeled trolley 61 is positioned on movable rail 69, the pivotable rail section 169 may be lowered to the lower uncoupled position (see dashed lines). The position of the pivotable rail section 169 may be controlled manually or automatically by the AMHS control system.

To ensure that the cradle rail 69 is positioned properly with respect to the stationary rails 64 at each docking station 100, 102, a commercially available position measurement system such as laser telemeters or others may be provided. Position measurement data recorded by the position measurement system may be input to the AMHS controller to control the position of the cradle rail 69.

With vehicle cradle 80 positioned as shown in FIG. 6, OHT vehicle 62 is rolled laterally through access port 73 and directly onto cradle rail 69 until the OHT vehicle is positioned completely within open central shaft 74 of vehicle lifter 70. The OHT vehicle 62 and cradle rail 69 are now in position for vertical movement within vehicle lifter 70.

Figure 7:
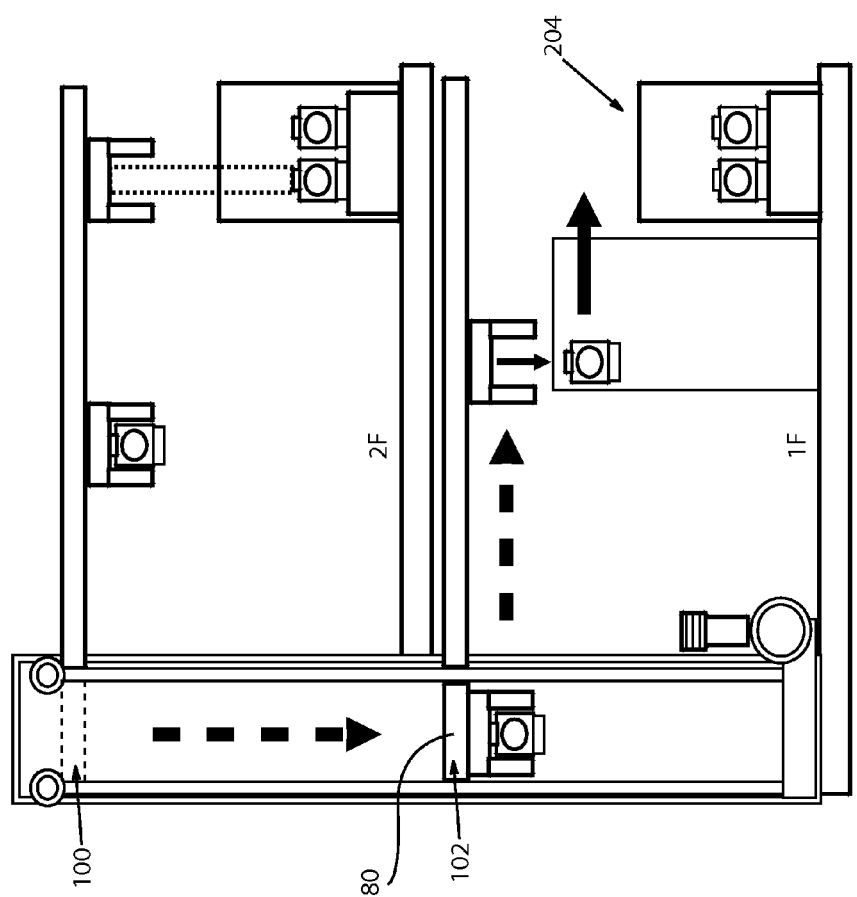
FIG. 7 is a side view similar to FIG. 6 showing the OHT vehicle and vehicle lifter at a second elevation and docking station associated with the vehicle lifter.

Referring to FIG. 2, the lifting mechanism 90 is activated by operation of the drive system 91. Motor 92 is operated to unwind and release cable 96 to lower vehicle cradle 80 from the first docking station 100 to the second docking station 102 as shown in FIG. 7. Movable cradle rail 69 is positioned in axially alignment with stationary rail 64 of the OHT system 60 on floor 1F adjacent access port 73 on the first floor. Cradle rail 69 is in close proximity or otherwise temporarily coupled to rail 64 so that OHT vehicle 62 may roll from cradle rail 69 through access port 73 onto stationary rail 64. The OHT vehicle 62 may then be transported by the OHT transport system 60 in the usual manner to a stocker 30, process or metrology tool 202, or other equipment or storage.

Advantageously, it will be appreciated that in the foregoing method, there is no handoff or dismounting of wafer carrier 50 from the OHT vehicle. The entire OHT vehicle 62 holding wafer carrier 50 travels directly into vehicle lifter 70 and transported between floors 2F and 1F to complete a cross-floor transport of wafers between two sections of rails 64 at different elevations in the FAB. Accordingly, the cross-floor transport is completed in a single operation without loading and unloading the wafer carrier 50 from the OHT vehicle 62. This approach reduces or eliminates vehicle traffic jams at the vehicle lifter 70 and reduces cross-floor transport delays. In some embodiments, the lifter 70 may complete approximately 120 moves per hour (MPH).

It will be appreciated that vehicle lifter 70 may be used to transfer the OHT vehicle 62 between sections of rail at two different elevations that may be within the same floor or bay, or on different floors entirely.

It will further be appreciated that the cross-floor transport system disclosed herein may be used to transport any type of rail guided wheeled vehicles between sections of rail at different elevations in the FAB. Accordingly, embodiments of a cross-floor transport system and vehicle lifter according to the present disclosure are not limited to OHT vehicles alone. The vehicle lifter may be appropriately configured to accommodate any type of wheeled vehicle by those skilled in the art without undue experimentation.

According to one embodiment of the present disclosure, an automated material handling system (AMHS) for a semiconductor fabrication facility (FAB) includes a rail transport system including a network of stationary rails and a wheeled vehicle movable on the rails via rolling movement. The vehicle is configured for holding a wafer carrier that stores a plurality of wafers. A vehicle lifter is provided that is positioned near the network of rails; the lifter extending between a first elevation and a second elevation each associated with the network of rails. The lifter is configured and operable to receive the vehicle directly from rails at the first elevation and vertically transport the vehicle to rails at the second elevation. In one embodiment, a wafer carrier is disposed in the wheeled vehicle and remains in the vehicle during vertical transport of the vehicle from the first to second elevations. The vehicle lifter is further operable to transfer the wheeled vehicle from the lifter directly onto the rails at the second elevation. In some embodiments, the vehicle lifter includes a vertically movable rail section configured to hold the wheeled vehicle; the rail section receiving or dispatching the wheeled vehicle via rolling the vehicle directly onto or off of the rail section. The rail section with vehicle positioned thereon moves from the first elevation to the second elevation.

According to another embodiment, an automated material handling system (AMHS) for a semiconductor fabrication facility (FAB) includes a rail transport system comprising a network of stationary rails including a first rail at a first elevation in the FAB and a second rail at a second elevation in the FAB, and a wheeled vehicle movable on the network of rails via rolling movement. The vehicle is configured for holding a wafer carrier that stores a plurality of wafers. The AMHS further includes a vehicle lifter positioned near the first and second rails; the lifter being configured and operable to transfer the wheeled vehicle directly from the first rail at the first elevation to the second rail at the second elevation. In some embodiments, the vehicle lifter includes a vertically movable vehicle cradle being complementary configured to the stationary first and second rails, which are mounted in the FAB. The vehicle cradle is operable for receiving or dispatching the wheeled vehicle via rolling the vehicle directly onto or off of the vehicle cradle. The vehicle cradle with vehicle positioned thereon moves from the first elevation to the second elevation. In other embodiments, the vehicle cradle is vertically movable rail section onto which the vehicle may be rolled. In some or all of the foregoing embodiments, a wafer carrier disposed in the wheeled vehicle and remains in the vehicle during vertical transport of the vehicle from the first to second elevations.

According to one embodiment of the present disclosure, a method for transporting a rail-guided wheeled vehicle in a semiconductor fabrication facility (FAB) includes: providing a rail transport system including a first rail mounted at a first elevation in the FAB and a second rail mounted at a second elevation in the FAB, and a rail-guided wheeled vehicle holding a wafer carrier that stores a plurality of wafers, the wheeled vehicle operable for rolling movement on the rails; rolling the wheeled vehicle from the first rail onto a vehicle lifter positioned at the first elevation, the vehicle lifter being complementary configured with the first and second rails; vertically moving the wheeled vehicle from the first elevation to the second elevation; and rolling the wheeled vehicle onto the second rail, wherein the wafer carrier remains in the wheeled vehicle during the vertically moving step. The vehicle lifter in some embodiments is a power-operated movable rail section that is vertically movable between the first and second elevations. In some embodiments, the method includes vertically moving the vehicle lifter with the wheeled vehicle positioned thereon from the first elevation to the second elevation during the vertically moving step.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that the present disclosure may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the disclosure. One skilled in the art will further appreciate that the disclosure may be used with many modifications of structure, arrangement, proportions, sizes, materials, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the disclosure being defined by the appended claims and equivalents thereof, and not limited to the foregoing description or embodiments. Rather, the appended claims should be construed broadly, to include other variants and embodiments of the disclosure, which may be made by those skilled in the art without departing from the scope and range of equivalents of the disclosure.

What is claimed is:

1. An automated material handling system (AMHS) for a semiconductor fabrication facility (FAB) comprising:
a rail transport system including a network of rails, a trolley, and a wheeled vehicle suspended from a stationary rail in the network of rails via the trolley and movable on the rails via rolling movement, the vehicle configured for holding a wafer carrier that stores a plurality of wafers;
a vehicle lifter positioned near the network of rails, the lifter extending between a first elevation and a second elevation each associated with the network of rails, the lifter being configured and operable to receive the vehicle from rails at the first elevation and vertically transport the vehicle to rails at the second elevation, the vehicle lifter comprising a movable vehicle cradle, and a movable rail attached to the movable cradle; and
a rail coupling system comprising a pivotable section of rail configured to rotate around a hinged pivot attached to the stationary rail,
wherein the movable rail is configured to move to align with the stationary rail so that the movable rail is in close proximity or coupled to the stationary rail through the pivotable section of the rail and the vehicle directly moves from tire stationary rail to the movable rail.

2. The system of claim 1, wherein the wheeled vehicle holds a wafer carrier, the wafer carrier remaining in the vehicle during vertical transport of the vehicle from the first elevation to second elevation.

3. The system of claim 1, wherein the lifter is further operable to transfer the wheeled vehicle from the lifter directly onto the rails at the second elevation.

4. The system of claim 1, further comprising a wafer carrier disposed in the wheeled vehicle, the wafer carrier remaining in the vehicle during vertical transport of the rail section and vehicle from the first to second elevations.

5. The system of claim 1, wherein the vehicle lifter comprises a lifting mechanism including a drive system operably coupled to the vertically movable rail section, the drive system operable to impart raising and lowering motions to the rail section.

6. The system of claim 5, wherein the lifting mechanism is configured and structured to support the combined weight of the rail section, wheeled vehicle, and wafer carrier fully loaded with wafers.

7. The system of claim 5, wherein the lifting mechanism includes a double mast support system including a pulley positioned on each mast and cables operably coupled to the drive system and movable rail section via the pulleys, wherein the drive system is operable to wind and unwind cable from the drive system to raise and lower the rail section.

8. The system of claim 1, wherein the wheeled vehicle is an overhead hoist transport (OHT) vehicle, the OHT vehicle operable to raise and lower the wafer carrier with respect to the OHT vehicle.

9. The system of claim 1, wherein the first elevation is on a first floor of the FAB and the second elevation is on a second floor of the FAB, the vehicle lifter being a cross-floor transport system.

10. The system of claim 1, wherein the wafer carrier is a front opening unified pod (FOUP) or standard mechanical interface (SMIF) pod that stores a plurality of wafers.

11. An automated material handling system (AMHS) for a semiconductor fabrication facility (FAB) comprising:
a rail transport system comprising a network of stationary rails including a first rail at a first elevation in the FAB and a second rail at a second elevation in the FAB;
a trolley;
a wheeled vehicle suspended from a stationary rail in the network of rails via the trolley and movable on the network of rails via rolling movement, the vehicle configured for holding a wafer carrier that stores a plurality of wafers;
a vehicle lifter positioned near the first and second rails, the lifter being configured and operable to vertically transfer the wheeled vehicle from the first rail at the first elevation to the second rail at the second elevation, the vehicle lifter comprising a movable vehicle cradle, and a movable rail attached to the movable cradle; and
a rail coupling system comprising a pivotable section of rail configured to rotate around a hinged pivot attached to the stationary rail,
wherein the movable rail is configured to move to align with the stationary rail so that the movable rail is in close proximity or coupled to the stationary rail through the pivotable section of the rail and the vehicle directly moves from the stationary rail to the movable rail.

12. The system of claim 11, further comprising a wafer carrier disposed in the wheeled vehicle, the wafer carrier remaining in the vehicle during transfer of the wheeled vehicle from the first rail to the second rail.

13. The system of claim 11, further comprising a wafer carrier disposed in the wheeled vehicle, the wafer carrier remaining in the vehicle during vertical movement of the vehicle cradle and wheeled vehicle from the first to second elevations.

14. The system of claim 11, wherein the vehicle cradle is vertically movable rail section.

15. The system of claim 11, wherein the wheeled vehicle is an overhead hoist transport (OHT) vehicle, the OHT vehicle operable to raise and lower the wafer carrier with respect to the OHT vehicle.

16. A method for transporting a rail-guided wheeled vehicle in a semiconductor fabrication facility (FAB) comprising:
providing the automated material handling system (AMHS) of claim 1;
rolling the wheeled vehicle from the first rail onto a vehicle lifter positioned at the first elevation, the vehicle lifter being complementary configured with the first and second rails;
vertically moving the wheeled vehicle from the first elevation to the second elevation; and
rolling the wheeled vehicle onto the second rail,
wherein the wafer carrier remains in the wheeled vehicle during the vertically moving step.

17. The method of claim 16, further comprising:
wherein the vehicle lifter is a power-operated movable rail section that is vertically movable between the first and second elevations.

18. The method of claim 16, further comprising:
vertically moving the vehicle lifter with the wheeled vehicle positioned thereon from the first elevation to the second elevation during the vertically moving step.

* * * * *